(12) United States Patent
Shu

(10) Patent No.: US 8,891,563 B2
(45) Date of Patent: Nov. 18, 2014

(54) MULTI-CHIP OPS-LASER

(75) Inventor: Qi-Ze Shu, Cupertino, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/545,593

(22) Filed: Jul. 10, 2012

(65) Prior Publication Data

US 2014/0016657 A1   Jan. 16, 2014

(51) Int. Cl.
*H01S 3/10* (2006.01)

(52) U.S. Cl.
USPC .................. 372/22; 372/21; 372/69; 372/70; 372/72

(58) Field of Classification Search
CPC ..... H01S 3/0092; H01S 3/0941; H01S 3/109; H01S 5/4012
USPC .................................. 372/21, 22, 69, 70, 72
See application file for complete search history.

(56) References Cited

U.S. PATENT DOCUMENTS

| | | | |
|---|---|---|---|
| 5,345,457 A | 9/1994 | Zenzie et al. | |
| 5,446,749 A | 8/1995 | Nighan, Jr. et al. | |
| 5,737,347 A | 4/1998 | Scheps et al. | |
| 5,809,048 A | 9/1998 | Shichijyo et al. | |
| 6,097,742 A | 8/2000 | Caprara et al. | |
| 6,130,900 A | 10/2000 | Black et al. | |
| 6,198,756 B1 | 3/2001 | Caprara et al. | |
| 6,816,519 B2 | 11/2004 | Momiuchi et al. | |
| 7,362,783 B2 | 4/2008 | Spiekermann et al. | |
| 7,408,970 B2 | 8/2008 | Mefferd et al. | |
| 7,447,245 B2 | 11/2008 | Caprara et al. | |
| 2005/0078718 A1* | 4/2005 | Spinelli et al. | 372/22 |
| 2006/0078033 A1* | 4/2006 | Betin et al. | 372/97 |
| 2007/0002925 A1* | 1/2007 | Zediker et al. | 372/98 |
| 2007/0291801 A1* | 12/2007 | Caprara et al. | 372/22 |
| 2011/0150013 A1* | 6/2011 | Spinelli et al. | 372/18 |
| 2012/0057608 A1 | 3/2012 | Seelert et al. | |
| 2013/0003761 A1* | 1/2013 | MacGillivray et al. | 372/18 |

FOREIGN PATENT DOCUMENTS

| | | |
|---|---|---|
| EP | 0301803 A2 | 2/1989 |
| EP | 0301803 A3 | 10/1989 |

OTHER PUBLICATIONS

Andersen et al., "Singly-Resonant Sum Frequency Generation of Visible Light in a Semiconductor Disk Laser", Optics Express, vol. 17, No. 8, Apr. 13, 2009, pp. 6010-6017.
Baer, T., "Large-Amplitude Fluctuations Due to Longitudinal Mode Coupling in Diode-Pumped Intracavity-Doubled Nd:YAG Lasers", Journal of the Optical Society of America B, vol. 3, No. 9, Sep. 1986, pp. 1175-1179.
Non Final Office Action received for U.S. Appl. No. 12/877,786, mailed on Dec. 13, 2011, 11 pages.
Final Office Action received for U.S. Appl. No. 12/877,786, mailed on Jul. 3, 2012, 14 pages.

* cited by examiner

*Primary Examiner* — Yuanda Zhang
(74) *Attorney, Agent, or Firm* — Morrison & Foerster LLP

(57) ABSTRACT

A two-chip OPS laser includes first and second OPS-chips each emitting the same fundamental wavelength in first and second resonators. The first and second resonators are interferometrically combined on a common path terminated by a common end-mirror. The interferometric combination provides for automatic wavelength-locking of the laser, which can eliminate the need for a separate wavelength selective device in the laser.

20 Claims, 4 Drawing Sheets

MULTI-CHIP OPS-LASER

TECHNICAL FIELD OF THE INVENTION

The present invention relates in general to external cavity, surface emitting, optically pumped, semiconductor lasers (OPS-lasers). The invention relates in particular to OPS-lasers having more than one surface-emitting semiconductor gain structure.

DISCUSSION OF BACKGROUND ART

OPS-lasers typically include a single "OPS-chip" which includes a multilayer mirror-structure surmounted by an epitaxially grown, multilayer, semiconductor gain structure. The gain structure generally includes quantum-well (QW) or active layers spaced apart by a half-wavelength at the peak gain wavelength by pump-light absorbing spacer layers. The OPS-chip is typically solder-bonded, "mirror-structure down", on a heat sink of some kind. The gain-structure is usually optically pumped by radiation from a diode-laser bar package. The mirror structure provides one mirror (either a fold-mirror or an end-mirror) of a laser-resonator. The laser-resonator usually includes a birefringent filter (BRF) for selecting a particular fundamental wavelength from a relatively broad gain bandwidth of the active layers. This BRF also establishes the polarization-orientation of the circulating and output radiation of the laser-resonator.

OPS-lasers have found use as sources of high-quality, continuous-wave (CW) laser beams with relatively high power. By varying the composition of the active layers and spacer layers, the fundamental lasing wavelength can be selected in a relatively large range of wavelengths from visible to near infrared (NIR). Intra cavity (IC) frequency conversion of the fundamental wavelength to harmonic wavelengths (frequency multiplication) or sum-component wavelengths (optical parametric conversion or frequency division) further extends the available wavelength range. This frequency conversion is effected by one or more optically nonlinear crystals in the laser-resonator The BRF in frequency-converted OPS-lasers fixes the fundamental radiation at a wavelength for which an optically nonlinear crystal is phase-matched.

U.S. Pat. No. 6,097,742, and U.S. Pat. No. 7,447,245, include detailed descriptions of OPS lasers delivering fundamental radiation; OPS lasers including IC harmonic generation; and OPS lasers including IC optical parametric oscillation (OPO). These patents are assigned to the assignee of the present invention and the complete disclosure thereof is hereby incorporated herein by reference.

The power available from an OPS-Chip by increasing pump-power is eventually limited by a phenomenon known to practitioners of the art as "thermal roll-off". This is caused by generation of free electrons which increase absorption in the chip, which generates more free-electrons, and so on, leading to a complete loss of power. The onset of thermal roll-off can be extended by suitable bonding and cooling techniques but not avoided altogether. If more out power is required, then the only approach available has been to include one or more additional OPS chips in a (multi-chip) resonator.

Early versions of multi-chip resonators were limited in performance because of variations in the lasing-mode path caused by thermal distortion of one or more of the chips. This would cause the mode on one chip to shift from coincidence with the pump light directed onto that chip thereby reducing the gain available from that chip. This was mitigated by further efforts in chip bonding, and in particular by designing resonators with 1:1 imaging relays for directing the mode onto the chips. One such arrangement is described in detail in U.S. Pat. No. 7,408,970, which is also assigned to the assignee of the present invention, and the complete disclosure of which is also hereby incorporated herein by reference.

Adding such relay optics (mirrors) adds significantly to the cost of forming a multi-chip OPS laser-resonator. As relay mirrors are never perfect, the addition of relay optics also adds to round-trip losses in the resonator reducing available output power. Further, the lasing mode is incident on the chips at non-normal incidence which reduces available power due to interference (fringe forming) effects between the incident and reflected modes on the chip which cause spatial hole-burning. There is a need for a multi-chip resonator design that avoids these problems of prior-art multi-chip OPS-lasers.

SUMMARY OF THE INVENTION

In one aspect, OPS-laser apparatus in accordance with the present invention comprises a first OPS-chip including a first multilayer semiconductor gain-structure surmounting a mirror-structure, a second OPS-chip including a second multilayer semiconductor gain-structure surmounting a second mirror-structure, an end-mirror, and a partially reflecting partially transmitting beam-splitter. A first laser-resonator is formed between the first mirror-structure and the end-mirror and includes the first multilayer gain-structure. A second laser-resonator is formed between the second mirror-structure and the end mirror and includes the second multilayer gain-structure. The first and second laser-resonators are combined on a common path between the beam-splitter and the end-mirror. When the first and second gain structures are energized by optical pump radiation, the first and second resonators generate laser radiation at the same wavelength and with the same polarization orientation.

In a preferred embodiment of the apparatus the beam-splitter is about 50 percent reflecting and about 50% transmitting at about the wavelength generated by the laser-resonators. The first and second resonators have different lengths, which locks the lasing wavelength without a need for an intra-resonator wavelength selective device.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
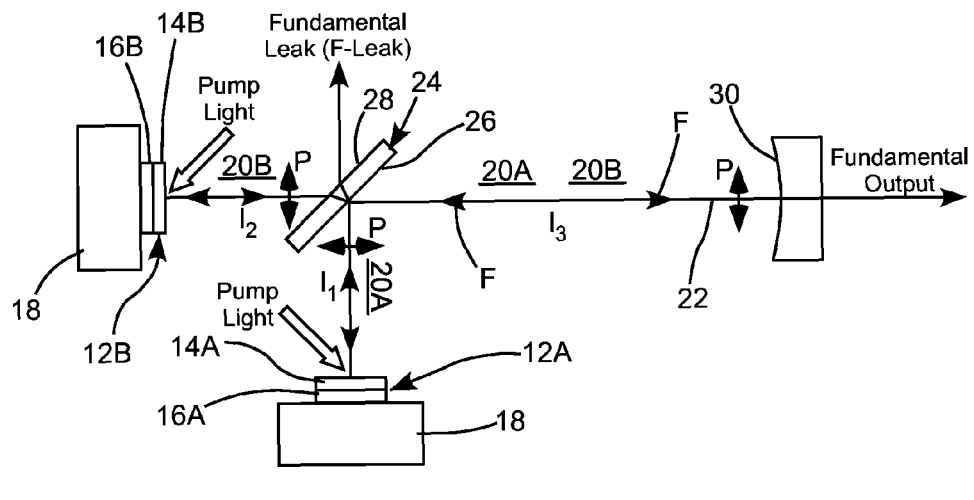
FIG. 1 schematically illustrates one preferred embodiment of a multi-chip OPS-laser in accordance with the present invention including first and second laser-resonators optically coupled by a partially reflecting and partially transmitting beam-splitter and having a common path between the beam-splitter and a common end mirror, a first separate path between the beam-splitter and a first OPS-chip, and a second separate path between beam-splitter and a second OPS-chip, the OPS-chips having about the same peak gain wavelength, and the common end mirror being an output coupling mirror for fundamental-wavelength radiation circulating on the common path.

Referring now to the drawings, wherein like components are designated by like reference numerals, FIG. 1 schematically illustrates one preferred embodiment 10 of a multi-chip OPS-laser in accordance with the present invention. Laser 10, as depicted, is a "two-chip" OPS laser. A first OPS chip 12A includes a multilayer gain-structure 14A surmounting a mirror-structure 16A, and a second OPS-chip 12B including a gain-structure 14B surmounting a mirror-structure 16B. Each OPS structure is bonded in thermal contact with a heat sink 18.

Preferably gain-structures 14A and 14B have the same peak-gain at the same peak-gain wavelength (for a given pump power). Some deviations, however, are tolerable, in return for less than optimum performance. This is discussed further herein below. Pump radiation (pump-light) is directed onto the chips, as indicated by arrows, from a source such as a diode-laser array package using suitable optics (not shown).

A laser-resonator 20A is formed between mirror-structure 16A of OPS-chip 12A and a concave end-mirror (output coupling-mirror) 30. A laser-resonator 20B is formed between mirror-structure 16B of OPS-chip 12B and concave end-mirror (output coupling-mirror) 30. The two resonators are coupled by a beam-splitter 24 having a partially reflective and partially transmitting coating 26 on one surface thereof, with an anti-reflection coating on the opposite surface 28. The antireflection coating is preferably optimized for a polarization-orientation parallel to the plane of incidence (p-polarization) as indicated by double arrow P. Note that the polarization orientation is the same in all resonator paths. Coating 26 is preferably 50% reflective and 50% percent transmissive. Here again, deviations from this preferred ratio, are tolerable, in return for less than optimum performance. This is also discussed further, herein below.

Resonators 20A and 20B have a common path 22 between beam-splitter coating 26 and common end-mirror 30. The resonators may also be regarded as a single compound resonator with branches 20A and 20B each including an OPS-gain structure. Branch 20A has a length $l_1$ branch 20B has a length $l_2$, and the common path has a length $l_3$.

Before proceeding further with this description of the present invention it is useful to emphasize what the combination of resonators 20A and 20B is not. It is not a spectral-coupling by a dichroic mirror of resonators operating at different wavelengths from different gain-medium in each resonator. It is not a polarization coupling by a polarizing beam-splitter of resonators each operating at the same wavelength but with orthogonally opposed different polarization orientations. Note that in these instances either resonator branch could lase independently if the other branch was not pumped and did not lase.

In inventive laser 10, if coating 26 had the preferred 50:50 reflection-to-transmission ratio, and if only one of the OPS-chips were pumped the corresponding resonator could not lase because of the 50% loss (either reflection or transmission) at beam-splitter coating 26. Laser output is only possible if both chips are pumped and reflection and transmission losses of the beam-splitter are overcome by maximizing constructive interference between beams directed along the common path and maximizing destructive interference between beams which would otherwise be directed out of the laser by transmission through, or reflection from, beam-splitter coating 26. This is designated as a fundamental leak in FIG. 1

It was postulated, and has been confirmed at least by theoretical investigation, that the well-known tendency of a laser-resonator to operate at a wavelength of lowest loss would automatically select an operating wavelength (resonant frequency) which would cause the desired constructive and destructive interference to occur. It was determined that at the resonant frequency the following equality is satisfied:

$$1 \cdot e^{ikl_3 \cdot \delta} \cdot (r^2 e^{i2kl_1 + g_1} + t^2 e^{i2kl_2 + g_2}) \cdot e^{ikl_3} = 1, \quad (1)$$

Where $g_1$ and $g_2$ are the saturated gains of the OPS-chips; r is the field reflection coefficient; t is the field transmission coefficient; k is the angular wavenumber $2\pi/\lambda$; $\delta$ is the output coupling fraction of end mirror 30; and $l_1$, $l_2$, and $l_3$ are the branch and common path lengths discussed above. It was further established that a quantity $$|rt(e^{i2kl_1 + g_1} - e^{i2kl_2 + g_2})|. \quad (2)$$

which is the fundamental leak, is minimized.

It was determined by analysis that, at least for a mismatch between lengths $l_1$ and $l_2$, the laser will self-lock at the resonant frequency (fundamental wavelength) at which the equality of equation (1) is satisfied, and quantity (2) is minimized. The mismatch provides that resonators 20A and 20B have different mode-spacing. The lasing wavelength will be one which is present in the mode spacing of each. This suggests, and has been confirmed at least by analysis that the bigger the mismatch between $l_1$ and $l_2$ the more stable the wavelength self-locking as it is less likely that the lasing wavelength will jump to another possible wavelength, within the gain-bandwidth of the OPS gain-structures, and common to both resonators. A path difference equal to or greater than about 5 mm is preferred. The path difference is preferably less than 50 mm.

Figure 2:
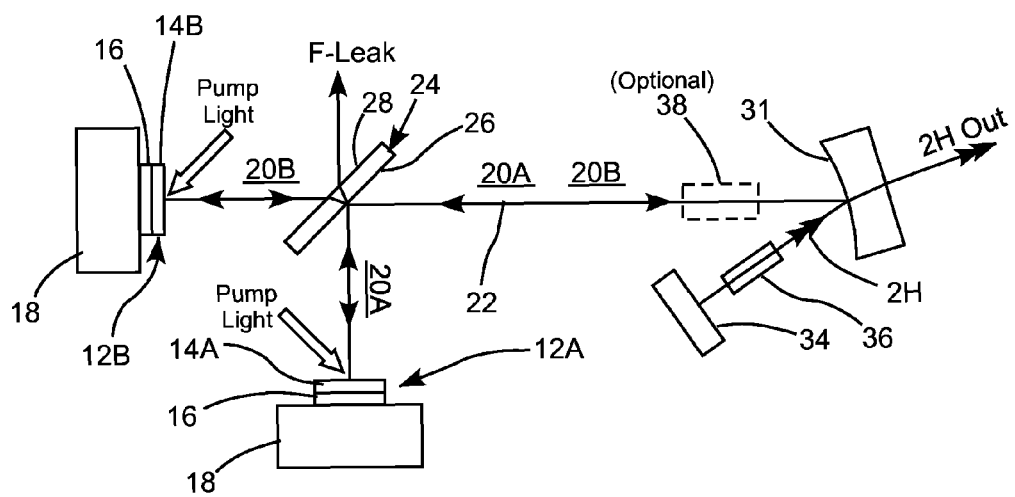
FIG. 2 schematically illustrates another preferred embodiment of a multi-chip OPS-laser in accordance with the present invention similar to the embodiment of FIG. 1 but including an optically nonlinear crystal on the common path for frequency doubling circulating fundamental radiation, and a fold mirror in the common path for delivering the frequency-doubled radiation from the laser.

The most extensive analysis of the inventive principle was performed for an intra-cavity frequency doubled laser depicted schematically as laser 40 in FIG. 2. Laser 40 is similar to laser 10 of FIG. 1 with an exception that common end-mirror 30 of FIG. 1 is replaced in laser 40 by a concave fold mirror 31 which directs the common path to a plane common end-mirror 34.

In the common path between mirrors 31 and 34 is an optically nonlinear crystal 36 arranged for type-1 frequency doubling of fundamental radiation circulating on the common path. Mirror 31 and mirror 34 are maximally reflective for the fundamental radiation. Mirror 31 is maximally transparent for the generated second-harmonic radiation designated by double arrowheads 2H in FIG. 2. The second harmonic radiation is delivered out of laser 40 by transmission through mirror 31. Optionally, a BRF 38 can be provided for wavelength locking the fundamental radiation within the acceptance bandwidth of crystal 36, but this can be omitted with a suitable mismatch between $l_1$ and $l_2$ or an edge-filter like design of the beam-splitter.

Figure 3:
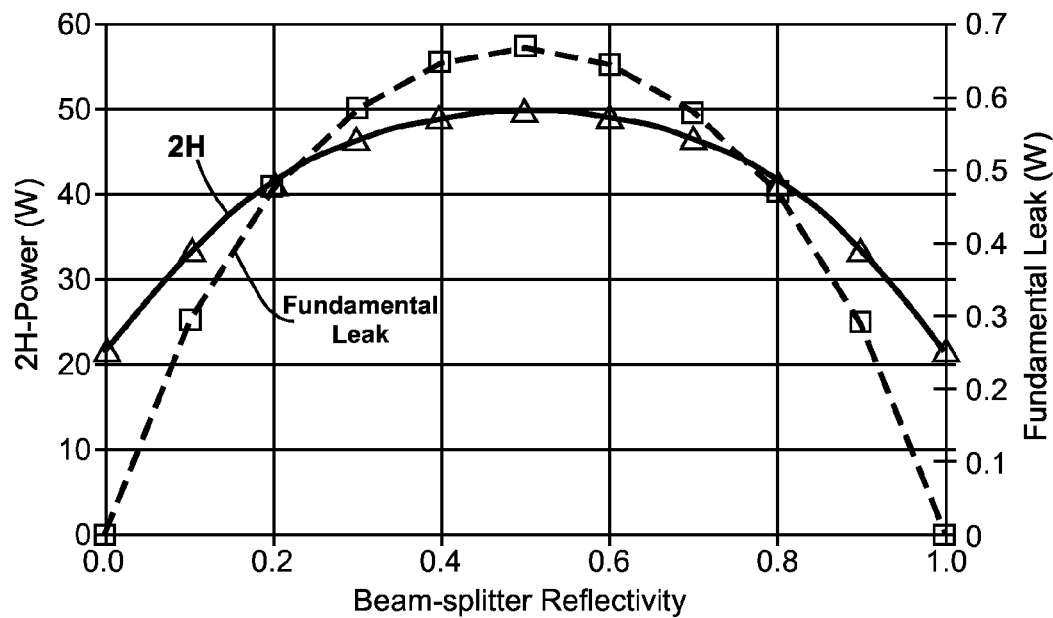
FIG. 3 is a graph schematically illustrating computed frequency-doubled power at the fold mirror and fundamental leakage at the beam-splitter as a function of reflectivity of the beam-splitter in an example of the laser of FIG. 2.

FIG. 3 is a graph schematically illustrating computed frequency-doubled (2H) power incident on fold mirror 31 and fundamental leakage from beam-splitter coating 26, as a function of the reflectivity of the coating, in an example laser 40 of FIG. 2. It is assumed that the coating is lossless and transmission is 1.0 minus the reflectivity. It is assumed that there is a mismatch of 5.0 mm between $l_1$ and $l_2$ and the common path length is 300.0 mm. It is assumed that crystal 36 is a LBO (lithium borate) crystal having a length of 3.0 mm, with a fundamental beam diameter of 85 micrometers (μm) in the crystal. It is further assumed that each OPS-chip is pumped with 60 W of pump-radiation.

It can be seen that the optimum reflectivity for the beam-splitter is about 50%, with about 50% transmission (0.5 and 0.5 in decimal notation). However, effective 2H-generation is predicted at reflectivity values between about 20% (0.2) and 80% (0.8), with respective transmission of between about 80% (0.8) and 20% (0.2). The term effective 2H-generation as used here means that the 2H-power may be greater than would be available from a corresponding single-chip resonator pumped at the same power.

Figure 4:
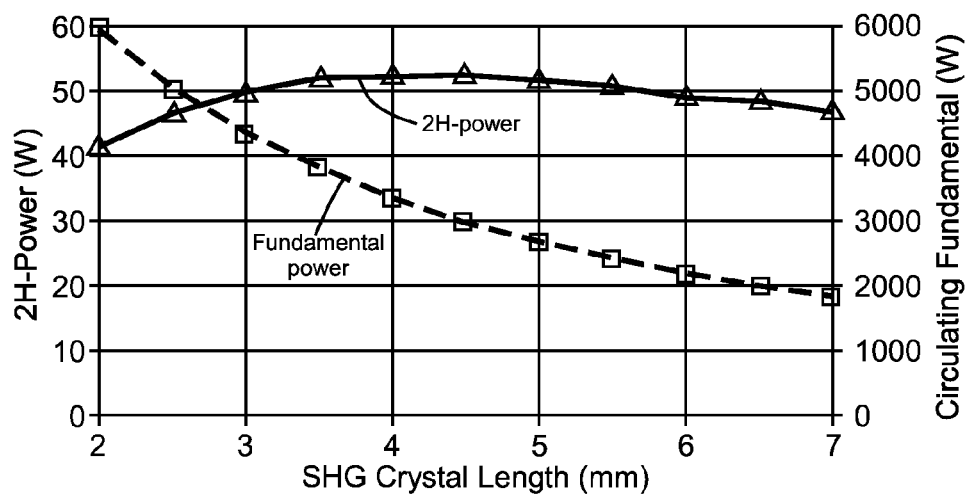
FIG. 4 is a graph schematically illustrating computed frequency-doubled power at the fold mirror and circulating IR power at the fold mirror as a function of length of the optically nonlinear crystal in the example of FIG. 3.

FIG. 4 is a graph schematically illustrating computed frequency-doubled (2H) power at fold mirror 31 and circulating IR power at the fold-mirror as a function of length of the LBO crystal in the example of FIG. 3. Note that the fundamental-leak power in FIG. 3, at a peak when reflectivity is 50%, is still only about 0.02% of the circulating fundamental power.

As noted in the background discussion above, in a prior-art IC frequency-doubled OPS-resonator, it is necessary to include a wavelength-selective element in the resonator to keep the oscillating wavelength within the acceptance bandwidth of the optically nonlinear crystal. If this is not done, the resonator will seek another oscillating wavelength within the relatively broad gain-bandwidth of the OPS-chip but outside the acceptance bandwidth of the crystal. Typically the gain-bandwidth at FWHM is on the order of 30 nanometers (nm). The acceptance bandwidth of the LBO crystal (for optimal conversion) in the above discussed example would be about 5.0 nm.

Figure 5A:
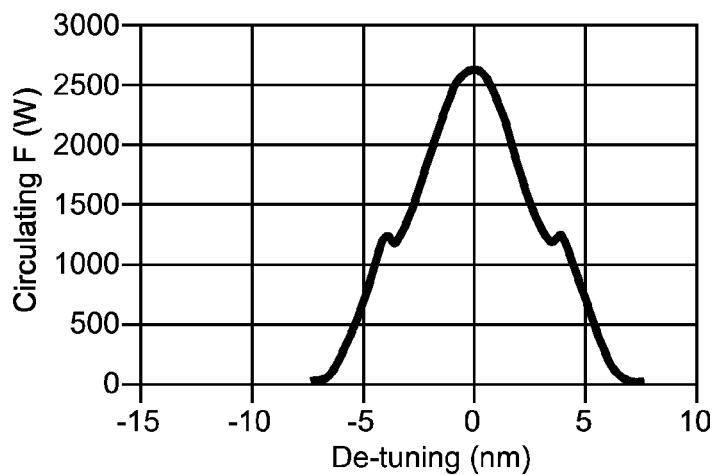
FIG. 5A, FIG. 5B, and FIG. 5C are graphs schematically illustrating, respectively, computed circulating fundamental power, computed frequency doubled power, and computed fundamental leakage as a function of detuning from a nominal peak-gain wavelength of the combined cavity in another example of the laser of FIG. 2.
Figure 5B:
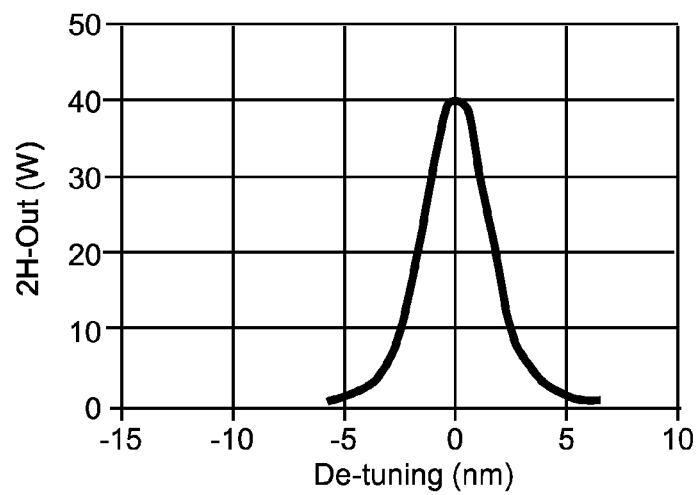
Figure 5C:
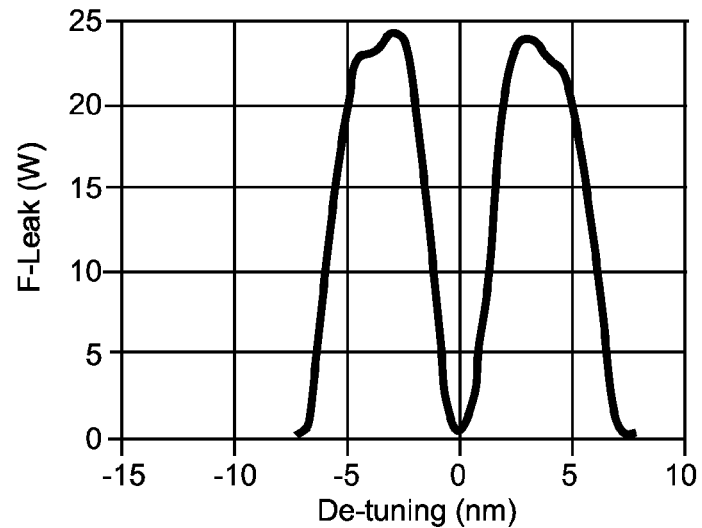

FIG. 5A, FIG. 5B, and FIG. 5C are graphs schematically illustrating, respectively, computed circulating fundamental power, computed frequency-doubled power, and computed fundamental leakage as a function of detuning from a nominal peak-gain wavelength of 1064 nm of the first and second OPS chips in an example of the laser of FIG. 2, similar to the example of FIG. 3 but wherein each OPS-chip is pumped with 50 W of pump radiation. The graphs essentially demonstrate what would happen if the fundamental lasing mode attempted to "escape" frequency-doubling by the optically nonlinear crystal.

FIG. 5C, in particular, illustrates that the fundamental leak or loss (F-leak) at the beam-splitter rises dramatically with increasing or decreasing wavelength. This provides that the lowest loss (highest gain) condition that the resonator actually seeks is within the acceptance bandwidth of the optically nonlinear crystal. In effect the interferometric nature of the F-leak performs the same function as an etalon and such an etalon is not necessary. In this example, adjacent modes of the interferometric fringes where the lasing could occur are suppressed by providing the beam splitter in the form of an edge filter with the reflection ramping from about zero to about 100% with 50% reflection at the nominal combined cavity wavelength.

Regarding the prior-art, multi-chip problem of mode-shifting on a chip. This is avoided in laser 10 (or laser 40) as, by design, the mode and pump-spot will remain aligned on the chips even if there is some sight warping of the chips. This warping may affect the overlapping of the modes (and constructive and destructive interference) on the beam-splitter, but not significantly, because of a relatively short distance from chip to beam-splitter and a relatively large mode-diameter at the beam-splitter.

In one test, stability of the inventive laser was theoretically investigated by sweeping or scanning length $l_1$ by 100 nm while all else remaining fixed. The parameters of the example of FIG. 3 were assumed in the calculation, i.e., a 5 mm difference between $l_1$ and $l_2$. As the sweep progressed, 2H power more or less cyclically fluctuated by ±0.5 W about a nominal 50 W mean, with about fourteen (14) fluctuation cycles occurring in the 100 nm-scan. There was a wavelength fluctuation of about ±50 picometers about the nominal 1064 nm, with the longest (plus 50 picometers) wavelengths in phase with the 2H-power maxima. The fundamental leak (F-leak) fluctuated from near zero to about 1.5 W, with the F-leak minima corresponding with 2H-power maxima. As the fluctuation distance of about 7 nm is within the range of motion of a piezoelectric transducer (PZT), it would be possible, if greater stability were required, to stabilize the laser by detecting the F-leak signal and minimizing that signal in a feedback loop including a PZT to adjust length $l_1$.

Figure 6:
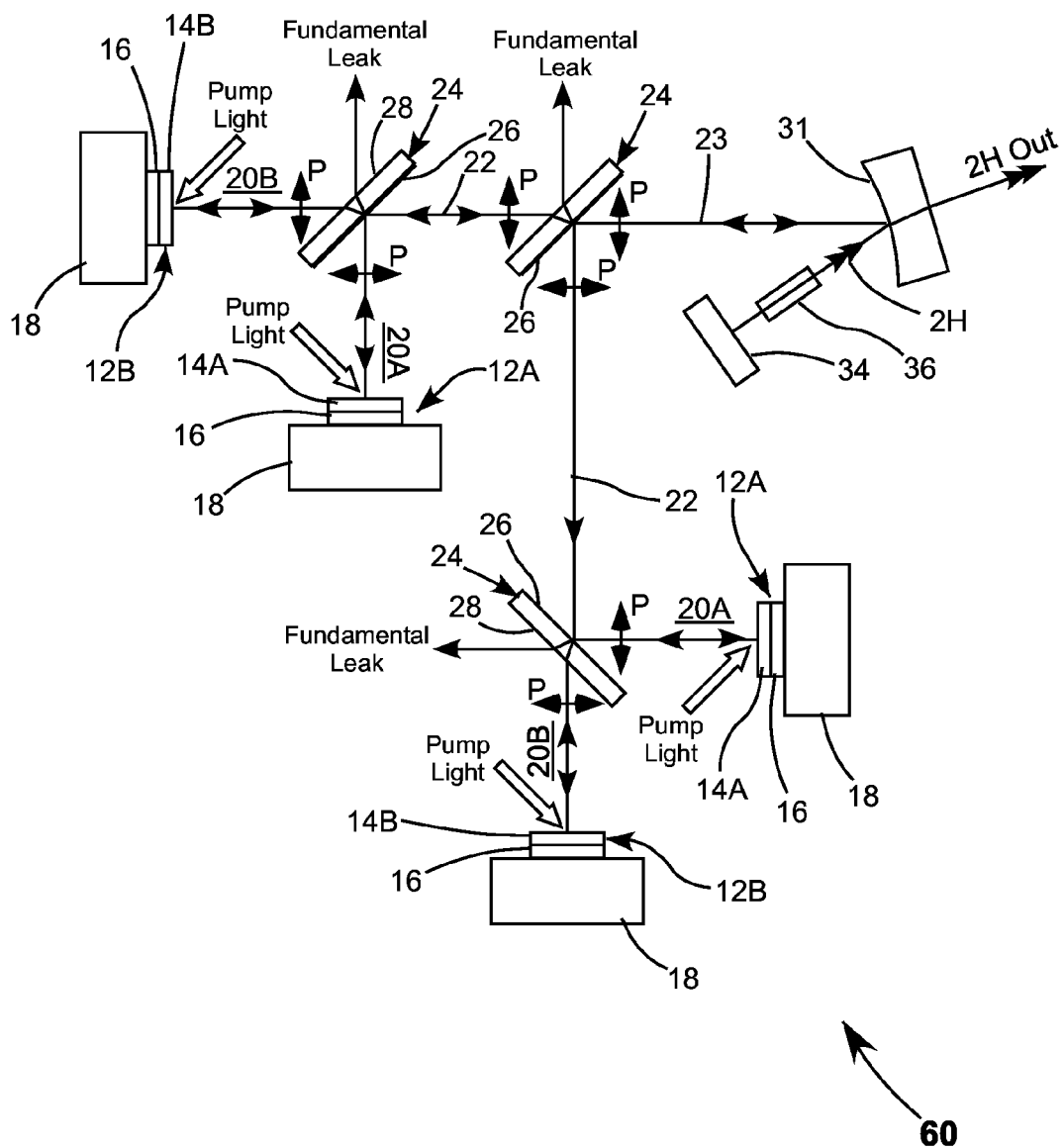
FIG. 6 schematically illustrates yet another preferred embodiment of a multi-chip laser in accordance with the present invention, similar to the laser of FIG. 2 but including in addition third and fourth OPS-chips in third and fourth resonator branches, with the output of all OPS-chips interferometrically combined by three beam-splitters.

FIG. 6 schematically illustrates yet another preferred embodiment 60 of a multi-chip OPS-laser (here a four-chip laser) in accordance to the present invention. Laser 60 is similar to laser 40 of FIG. 2 with an exception that there is an additional pair of OPS-chips 12A and 12B with outputs thereof interferometrically combined by a beam-splitter coating 26. The interferometrically combined outputs of the original pair of OPS chips on the original common or path 22, and the interferometrically combined outputs of the additional pair of OPS chips on an additional common path 22 are interferometrically combined by a third beam-splitter coating 26 on a common path 23. This common path 23 is incident on fold-mirror (2H output mirror) 31 and is directed onto end mirror 34 through optically nonlinear crystal 36 as in laser 40 of FIG. 3.

In theory at least two 4-chip arrangements as depicted in FIG. 6 could have two common paths 23 thereof combined into a fourth common path, then directed to a common end-mirror to provide and eight-chip OPS-laser. Generally, in theory at least the inventive multichip lends itself to providing $2^N$-chip (where N is an integer) OPS-lasers which do not require 1:1 imaging relay optics to prevent "mode-wandering" on the chips, and do not require a separate wavelength-selecting device in the resonator. In practice four or more chips, it may be difficult for the laser to self-determine a suitable lasing wavelength, due to the increasing number of ports where leakage can occur.

In summary, the present invention is described above in terms of a preferred and other embodiments. The invention, however, is not limited to the embodiments described and depicted herein. Rather the invention is limited only by the claims appended hereto.

What is claimed is:
1. OPS-laser apparatus, comprising:
a first OPS-chip including a first multilayer semiconductor gain-structure surmounting a mirror-structure;

a second OPS-chip including a second multilayer semiconductor gain-structure surmounting a second mirror-structure;
an end-mirror;
a partially reflecting partially transmitting beam-splitter, said beam splitter not relying on polarization or wavelength discrimination for splitting the radiation generated by the first and second OPS-chips;
a first laser-resonator formed between the first mirror-structure and the end mirror and including the first multilayer gain-structure;
a second laser-resonator formed between the second mirror-structure and the end mirror and including the second multilayer gain-structure, the first and second laser-resonators being combined on a common path between the beam-splitter and the end mirror and wherein, when the first and second gain structures are energized by optical pump radiation, the first and second resonators generate laser-radiation at the same fundamental wavelength and with the same polarization orientation and wherein the first and second resonators have different lengths and wherein the resonators do not include a spectrally selective element for selecting the fundamental wavelength of the laser-radiation generated by the laser-resonators and wherein the fundamental wavelength radiation is either delivered as the output of the apparatus or used in a frequency conversion process to output harmonic radiation.

2. The apparatus of claim 1, wherein the beam-splitter is between about 20% and 80% reflecting and, respectively, between about 80% and 20% transmitting for the fundamental-wavelength radiation generated by the laser-resonators.

3. The apparatus of claim 2, wherein the beam-splitter is about 50% reflecting and about 50% transmitting for the fundamental-wavelength radiation generated by the laser-resonators.

4. The apparatus of claim 1 wherein the length difference of the laser-resonators is equal to or greater than about 5 millimeters.

5. The apparatus of claim 1, wherein the end-mirror is partially transmissive at the wavelength generated by the laser-resonators for delivering the fundamental-wavelength radiation generated by the laser-resonators from the laser-resonators.

6. The apparatus of claim 1, further including an optically nonlinear crystal arranged in the common path of the laser-resonators for frequency-doubling the fundamental-wavelength radiation generated by the laser-resonators to provide second-harmonic radiation.

7. The apparatus of claim 6, wherein the common path of the laser-resonators is folded by a fold mirror located between the beam-splitter and the end-mirror and the optically nonlinear crystal is located between the fold-mirror and the end mirror.

8. The apparatus of claim 7, wherein the fold mirror is highly reflective for the fundamental-wavelength radiation and highly transmissive for the second-harmonic radiation for delivering the second-harmonic radiation from the laser-resonators.

9. OPS-laser apparatus, comprising:
a first OPS-chip including a first multilayer semiconductor gain-structure surmounting a mirror-structure;
a second OPS-chip including a second multilayer semiconductor gain-structure surmounting a second mirror-structure;
an end-mirror;
a partially reflecting partially transmitting beam-splitter, said beam splitter not relying on polarization or wavelength discrimination for splitting the radiation generated by the first and second OPS-chips;
a first laser-resonator formed between the first mirror-structure and the end mirror and including the first multilayer gain-structure;
a second laser-resonator formed between the second mirror-structure and the end mirror and including the second multilayer gain-structure, the first and second laser-resonators being combined on a common path between the beam-splitter and the end mirror;
wherein, when the first and second gain structures are energized by optical pump radiation, the first and second resonators generate laser-radiation at the same fundamental wavelength and with the same polarization orientation; and
wherein an optically nonlinear crystal is arranged in the common path of the laser-resonators for frequency-doubling the fundamental-wavelength radiation generated by the laser-resonators to provide second-harmonic radiation and wherein the optically nonlinear crystal has an acceptance bandwidth for the second-harmonic generation and wherein the first and second resonators have different lengths and wherein the resonators do not include a spectrally selective element for maintaining the fundamental wavelength of the laser-radiation generated by the laser-resonators within the acceptance bandwidth of the optically nonlinear crystal and wherein the second harmonic radiation is delivered as output from the apparatus.

10. The apparatus of claim 9, wherein the common path of the laser-resonators is folded by a fold mirror located between the beam-splitter and the end-mirror and the optically nonlinear crystal is located between the fold-mirror and the end mirror.

11. The apparatus of claim 10, wherein the fold mirror is highly reflective for the fundamental-wavelength radiation and highly transmissive for the second-harmonic radiation for delivering the second-harmonic radiation from the laser-resonators.

12. The apparatus of claim 11, wherein the beam-splitter is about 50% reflecting and about 50% transmitting at about the fundamental wavelength generated by the laser-resonators.

13. The apparatus of claim 9 wherein the length difference of the laser-resonators is between about 5 millimeters and about 50 millimeters.

14. A laser apparatus comprising:
a first laser resonator including a first OPS chip and an end mirror and a partially transmissive beam splitter therebetween; and
a second laser resonator that partially overlaps the first resonator to define a common path from the beam splitter to the end mirror, said second laser resonator including a second OPS chip, wherein the first and second OPS chips are respectively located in the non-overlapping portions of the first and second resonators, said first and second chips being optically pumped and generating substantially the same fundamental wavelength radiation and wherein the lengths of the first and second resonators are different and wherein the resonators do not include a spectrally selective element for selecting the fundamental wavelength radiation generated by the laser resonators and wherein the beam splitter does not rely on polarization or wavelength discrimination for splitting the radiation generated by the first and second OPS chips and wherein the fundamental wavelength radiation is either delivered as the output of the apparatus or used in a frequency conversion process to output harmonic radiation.

15. The laser apparatus of claim 14 wherein the difference in length between the first and second resonators is equal to or greater than about 5 millimeters.

16. The laser apparatus of claim 15 further including a nonlinear crystal located in the common portion of the resonators for frequency converting the fundamental wavelength radiation output of the first and second chips.

17. The laser apparatus of claim 16 further including a fold mirror between the end mirror and the beam splitter, with said nonlinear crystal being located between the end mirror and the fold mirror and with the fold mirror being highly reflective of the fundamental wavelength radiation and highly transmissive of the frequency converted wavelength radiation.

18. The laser apparatus of claim 15, wherein the beam splitter is between about 20% and 80% reflecting and, respectively, between about 80% and 20% transmitting for the fundamental wavelength radiation.

19. The laser apparatus of claim 15, wherein the beam splitter is about 50% reflecting and about 50% transmitting for the fundamental wavelength radiation.

20. The laser apparatus of claim 14 wherein the difference in length between the first and second resonators is between about 5 millimeters and about 50 millimeters.

\* \* \* \* \*